United States Patent [19]

Ray

[11] Patent Number: 5,407,488

[45] Date of Patent: Apr. 18, 1995

[54] METHOD AND APPARATUS FOR IN-SITU REMOVAL OF MATERIAL FROM OPENINGS IN A STENCIL

[75] Inventor: Rajarshi Ray, Princeton, N.J.

[73] Assignee: AT&T Corp., Murray Hill, N.J.

[21] Appl. No.: 134,702

[22] Filed: Oct. 12, 1993

[51] Int. Cl.⁶ .................................................. B08B 7/00
[52] U.S. Cl. ........................................ 134/6; 134/16; 134/23; 134/32; 134/42
[58] Field of Search .................... 134/6, 16, 23, 32, 38, 134/42

[56] References Cited

U.S. PATENT DOCUMENTS

| | | | |
|---|---|---|---|
| 3,833,123 | 9/1974 | Walker | 210/241 |
| 3,902,414 | 9/1975 | Zimmer et al. | 101/129 |
| 4,462,174 | 7/1984 | Messerschmitt | 38/102.1 |
| 4,826,539 | 5/1989 | Harpold | 134/10 |

*Primary Examiner*—Melvyn J. Andrews
*Assistant Examiner*—Sean Vincent
*Attorney, Agent, or Firm*—Robert B. Levy

[57] ABSTRACT

In-situ removal of material, such as solder paste (12), from openings (26—26) in a stencil (22) is accomplished by imparting a vibrational motion to the stencil. In practice, the stencil (22) may be vibrated by one or more DC solenoids (28—28), each having its plunger (28) in contact with the periphery of the stencil and each excited with AC so that the solenoid plunger undergoes a linear oscillation to vibrate the stencil.

5 Claims, 1 Drawing Sheet

METHOD AND APPARATUS FOR IN-SITU REMOVAL OF MATERIAL FROM OPENINGS IN A STENCIL

TECHNICAL FIELD

This invention relates to a technique for in-situ removal of material, such as solder paste, from openings in a stencil.

BACKGROUND OF THE INVENTION

Solder paste is typically deposited onto metallized areas on a substrate (i.e., a circuit board) by a screen printer that employs a stencil having a set of openings arranged in the same pattern as the metallized areas on the circuit board. To print paste onto the circuit board, the screen printer maintains a stencil a short distance from the circuit board such that the stencil openings are aligned with the metallized areas. Once the circuit board is in aligned registration with the stencil, a squeegee blade metal sweeps across the stencil surface to force a volume of solder paste, deposited onto the top surface of the stencil, through the stencil openings and onto the metallized areas on the circuit board The quality of the pattern of solder paste printed onto the circuit board is dependent on several factors, including the degree to which the stencil openings remain free from obstructions. During the process of printing solder paste onto the circuit board, a small amount of solder paste often adheres to the walls of each stencil opening. Since most solder pastes contain a volatile vehicle, the paste remaining in the stencil openings tends to dry out, leaving behind a residue clogging the openings. As the stencil openings become clogged, the volume of paste deposited onto the circuit board decreases. The diminution in solder paste volume may adversely affect the quality and reliability of the solder joint with each of the metallized areas on the circuit board.

In the past, the problem of clogging of the stencil openings was addressed by removing the stencil from use and thereafter manually wiping it with a solvent-soaked rag to remove those paste residues on the stencil. There are several disadvantages to cleaning the stencil in this manner. First, such cleaning requires the intervention of an operator and may result in significant down time if the stencil must be removed from the printer. Secondly, cleaning the stencil with solvent presents environmental issues depending on the nature of the solvent.

Thus, there is a need for a technique for effecting in-situ removal of material (i.e., solder paste) from openings in a stencil without reliance on the use of solvents.

SUMMARY OF THE INVENTION

Briefly, in accordance with a preferred embodiment of the invention, there is disclosed a technique for in-situ removal of material from openings in a stencil following the printing of the material through the stencil openings onto a substrate. The method is practiced by first displacing the substrate from the stencil once a volume of material has been forced through the stencil openings for deposit onto the substrate. Thereafter, the stencil is vibrated, typically by electromechanical means, such as by one or more piezoelectric crystals or solenoids, causing the material that had previously adhered to the walls of the stencil openings to be separated therefrom. In this way, the incidence of stencil clogging can be reduced without the use of any solvents.

DETAILED DESCRIPTION

Figure 1:
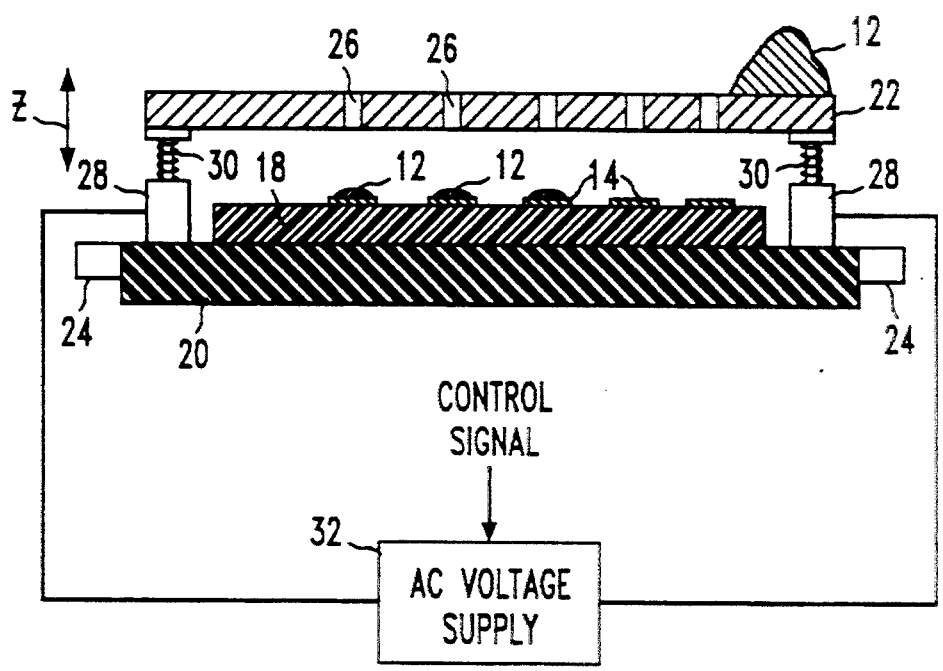
FIG. 1 shows a front view, in cross-section, of an apparatus in accordance with a preferred embodiment of the invention for in-situ removal of material from openings in a stencil.

FIG. 1 shows a portion of a stencil printer 10 for printing a volume of solder paste 12 onto each of a plurality of metallized areas 14—14 on a first major surface 16 of a substrate 18, such as a printed wiring board. In its simplest form, the stencil printer 10 comprises a bed 20 that supports the printed wiring board 18 in spaced relationship below a stencil 22. The distance between the stencil 22 and the printed wiring board 18 has been exaggerated in FIG. 1 for purposes of illustration. Means (not shown), typically in the form of one or more fluid cylinders, are provided to displace the stencil 22 to and from the bed 20 to allow the printed wiring board 18 to be placed on the bed without interference from the stencil. A conveyor 24 (only partially shown) or another type of prime mover such as a robot (not shown) may be provided for automatically shuttling the printed wiring board 18 on and off the bed 20.

The stencil 22 is typically comprised of a thin metal plate (i.e., brass or stainless steel) whose thickness has been exaggerated in FIG. 1 for purposes of illustration. The stencil 22 has a plurality of openings 26—26 arranged in the same pattern as the metallized areas 14—14 on the surface 16 of the printed wiring board 18 onto which the paste 12 is to be deposited. To print the solder paste 12 onto the metallized areas 14—14 that are to be solder-paste coated, the printed wiring board 18 is first positioned relative to the stencil 22 so that each of the stencil openings 26—26 lies in aligned registration with a corresponding one of the metallized areas on the printed wiring board. Thereafter, a quantity of the solder paste 12 is deposited on the upper surface of the stencil 22. Finally, a squeegee blade (not shown) sweeps across the stench 22 to force the paste through the stencil openings 26—26 and onto the metallized areas 14—14 on the printed wiring board 18.

As the paste 12 is forced through the stencil openings 26—26, some of the paste adheres to the walls of the openings. In practice, the solder paste 12 is comprised of a mixture of solder powder, flux and different rheological agents, the combination of ingredients carried by a vehicle that itself is volatile. Thus, overtime, the solder paste 12 remaining in the stench openings 26—26 dries out, leaving a residue that may ultimately clog the openings. The stencil openings may even be clogged due to the viscosity of the paste used. As the stencil openings 26—26 become clogged with paste, the volume of paste that can be printed onto the metallized areas 14—14 on the printed wiring board 18 is reduced, thereby adversely affecting the quality and reliability of the resultant solder joint formed with such metallized areas.

Removing the paste 12 that has accumulated in the stencil openings 26—26 after printing will eliminate the incidence of clogging. In the past, the accumulated paste 12 was removed by wiping the stencil 22 with a solvent-covered rag (not shown). Not only does such cleaning increase the need for manual labor, but also, this method presents environmental issues since a relatively strong solvent is required for dissolving the paste 12.

In accordance with the invention, there is provided a technique for automatically accomplishing environmentally-friendly, in-situ removal of solder paste 12 from the stencil openings 26—26 without the need for extensive manual effort. I have discovered that by imparting a vibratory motion to the stencil 22 following the printing of solder paste 12 onto the metallized areas 14—14, the solder paste remaining in the stencil openings 26—26 will separate itself from the stencil. Thus, by imparting a vibratory motion to the stencil 22, I can effect in-situ removal of residues from the stench openings 26—26 without the need for solvents or the like.

In the illustrated embodiment shown in FIG. 1, a vibratory motion may be imparted to the stencil 26 by way of a plurality of Direct Current (DC) solenoids 28—28. The solenoids 28—28 each extend upwardly from the bed 20 such that each solenoid has its plunger 30 in contact at a separate point on the periphery of the stencil 22 outside the area occupied by the openings 26—26. Each of the solenoids 28—28 is energized with an Alternating Current (AC) voltage from an adjustable AC voltage supply 32. The receipt of an AC voltage by each solenoid 28 causes the plunger 30 of that solenoid to oscillate along the z axis. The degree of oscillation of the plunger 30 of each solenoid 28 may be controlled by adjusting the magnitude of the AC voltage supplied to solenoid by the AC voltage supply 32. Each solenoid 28 should be sufficiently excited such that its plunger 30 contacts the stencil 22 and imparts a vibratory motion thereto. Rather than employ the solenoids 28—28 to vibrate the stencil 22, other devices such as a piezoelectric crystal also may be employed for this purpose. By using piezoelectric crystals, the stencil may be vibrated at high frequencies (i.e., 100 kHz to 5 GHz).

The frequency of the vibration imparted to the stencil 22 is determined by the frequency of the oscillation of the plunger 30 of each solenoid 28. The frequency of the oscillation of each solenoid plunger 30 varies in accordance with the frequency of the AC voltage supplied to the solenoid 28 from the AC voltage supply 32. In practice, I have found an oscillation frequency of approximately 7200 Hz to be suitable for vibrating the stencil 22 in order to shake off solder paste remaining in the stencil openings 26—26 although a higher or lower frequency may also be effective as well. Typically, the ac current employed to vibrate the stencil 22 is rectified. However, unrectified current could be used, allowing a vibration frequency of 3600 Hz. Other frequencies between 3600 Hz to 100 kHz may be used.

In-situ removal of residues from the stencil openings 26—26 by vibrating the stencil 22 is best done after a volume of solder paste 12 has already been deposited onto the printed wiring board 18, and the printed wiring board has been carried from the bed 20 by the conveyor 24. In this way, the residues that are shaken from openings in the stencil 22 drop onto the bed 18 rather than onto the printed wiring board 18. Alternatively, when the stencil 22 is vibrated, the paste in the stencil openings 22 may be displaced to the solid portion of the stencil. To assure that the stencil 22 is only vibrated after the printed wiring board 18 has been printed with paste and then displaced from the bed 20, the AC power supply 32 remains inactive until the printed wiring board 18 has been displaced from the bed 20. Once the printed wiring board 18 has been displaced from the bed 20, then the power supply is rendered active by a control signal to cause the stencil 22 to be vibrated by the solenoids 28—28 (or by piezoelectric devices when employed).

The foregoing describes an technique for in-situ removal of residues from a stencil 22 to reduce the incidence of clogging of the stencil openings 26—26.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method for effecting in-situ removal of material from openings in a stencil following the printing of material through the stencil openings onto a surface, comprising the steps of:
   displacing the surface away from the stencil once a volume of the material has been printed onto the surface; and
   vibrating the stencil to cause material remaining in the stencil openings to separate therefrom to maintain the stencil openings substantially free from material to improve the quality of a subsequent printing operation.

2. The method according to claim 1 wherein the stencil is electromechanically vibrated.

3. The method according to claim 2 where the stencil is vibrated by the steps of:
   contacting the stencil with a plunger of a solenoid; and
   exciting the solenoid with electrical power such that the solenoid plunger will oscillate and cause the stencil to vibrate.

4. The method according to claim 2 wherein the stencil is contacted with the plunger of each of a plurality of solenoids, each solenoid excited with electrical power so as to vibrate the stencil.

5. The method according to claim 1 wherein the stencil is vibrated at a frequency between 3600 Hz to 100 kHz.

* * * * *